(12) United States Patent
Chun

(10) Patent No.: US 10,186,684 B2
(45) Date of Patent: Jan. 22, 2019

(54) DISPLAY DEVICE

(71) Applicant: Samsung Display Co., Ltd., Yongin-si, Gyeonggi-do (KR)

(72) Inventor: Yong Hoon Chun, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 21 days.

(21) Appl. No.: 15/453,838

(22) Filed: Mar. 8, 2017

(65) Prior Publication Data
US 2017/0263890 A1    Sep. 14, 2017

(30) Foreign Application Priority Data
Mar. 10, 2016    (KR) .................. 10-2016-0028992

(51) Int. Cl.
*H01L 51/52*    (2006.01)
*H01L 51/00*    (2006.01)

(52) U.S. Cl.
CPC ...... *H01L 51/5253* (2013.01); *H01L 51/0097* (2013.01); *H01L 51/524* (2013.01); *H01L 51/5281* (2013.01); *H01L 2251/5338* (2013.01)

(58) Field of Classification Search
CPC . H01L 51/5253; H01L 51/56; H01L 51/0097; H01L 51/525; H01L 23/28; H01L 23/4985; H01L 2251/5338; H01L 21/84; H01L 27/3244; H01L 2251/5238; H01L 2251/558; H01L 51/524; H01L 51/5281; H01L 51/5237
See application file for complete search history.

(56) References Cited

U.S. PATENT DOCUMENTS

| | | | |
|---|---|---|---|
| 2006/0273304 A1* | 12/2006 | Cok | H01L 51/0096 257/40 |
| 2010/0073620 A1* | 3/2010 | Yamaguchi | G02F 1/133305 349/160 |
| 2014/0063719 A1* | 3/2014 | Yamazaki | G06F 1/1601 361/679.21 |
| 2015/0171363 A1 | 6/2015 | Guo et al. | |
| 2017/0125728 A1* | 5/2017 | Dighde | H01L 27/3258 |

FOREIGN PATENT DOCUMENTS

| | | |
|---|---|---|
| JP | 2008-209486 A | 9/2008 |
| KR | 10-1164945 B1 | 7/2012 |
| KR | 10-2014-0077624 A | 6/2014 |
| KR | 10-2014-0143131 A | 12/2014 |

* cited by examiner

*Primary Examiner* — Caridad Everhart
(74) *Attorney, Agent, or Firm* — Lewis Roca Rothgerber Christie LLP

(57) ABSTRACT

A display device is disclosed. In one aspect, the display device includes a flexible display panel, and a first protection film attached to the flexible display panel and including a plurality of openings at least two of which have different sizes.

18 Claims, 12 Drawing Sheets

DISPLAY DEVICE

RELATED APPLICATIONS

This application claims priority to and the benefit of Korean Patent Application No. 10-2016-0028992 filed in the Korean Intellectual Property Office on Mar. 10, 2016, the entire contents of which are incorporated herein by reference.

BACKGROUND

Field

The described technology generally relates to a display device.

Description of the Related Technology

An organic light-emitting diode (OLED) display produces an image using a matrix of organic light-emitting elements.

In general, in such OLED displays, the organic light-emitting elements are positioned over the substrate, and an encapsulation unit encapsulates the elements along with the substrate.

Recently, a flexible type of OLED display has been developed in which a part is bent by including a flexible substrate made of an organic material.

A flexible OLED display can additionally include a protection film adhered to a rear surface of the flexible substrate so as to reduce damage to the display caused by external impacts.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

One inventive aspect relates to a display device with improved flexibility even when including a protection film.

Another aspect is a display device that can control a neutral plane by using a protection film.

Another aspect is a display device including a flexible display panel, and a first protection film adhered to the flexible display panel and including a plurality of openings having different sizes.

The first protection film may have a mesh shape in a plane view.

A thickness of the first protection film may be thicker than a thickness of the flexible display panel.

The first protection film may include an organic material.

The flexible display panel may have a shape that is bent in one direction, and the flexible display panel may include a first bending part having a first curvature radius and a second bending part having a second curvature radius smaller than the first curvature radius.

The second bending part may be closer to a border of the flexible display panel compared with the first bending part.

The plurality of openings may include a first opening corresponding to the first bending part and having a first size, and a second opening corresponding to the second bending part and having a second size different from the first size.

The second size may be larger than the first size.

The first protection film may include a first film part corresponding to the first bending part and having a first thickness, and a second film part corresponding to the second bending part and having a second thickness different from the first thickness.

The second thickness may be thinner than the first thickness.

A first adhesive layer positioned between the first protection film and the flexible display panel may be further included, and the first adhesive layer may be positioned inside the plurality of openings.

A second protection film adhered to the first protection film and covering the plurality of openings may be further included.

A second adhesive layer positioned between the first protection film and the second protection film may be further included, and the second adhesive layer may be positioned inside the plurality of openings.

A polarizer positioned on the first protection film via the flexible display panel and a window positioned on the polarizer may be further included.

The flexible display panel may include a flexible substrate and an organic light-emitting element positioned on the flexible substrate.

Another aspect is a display device including a flexible display panel including a first bending part and a second bending part bent in one direction, and a first protection film adhered to the flexible display panel and including a first opening corresponding to the first bending part and a second opening corresponding to the second bending part.

The second bending part may have a smaller curvature radius than the first bending part, and the second opening may have a larger size than the first opening.

The thickness of the first film part of the first protection film corresponding to the second bending part may be thinner than the thickness of the second film part of the first protection film corresponding to the first bending part.

Another aspect is a display device including a flexible display panel and an insulating protection film adhered to the flexible display panel and having a mesh shape.

Another aspect is a display device including: a flexible display panel; and a film assembly including a first protection film positioned on the flexible display panel, a first adhesive layer positioned between the first protection film and the flexible display panel, and the first protection film and a plurality of openings formed in at least one of the first adhesive layer and having different sizes.

Another aspect is a display device including a flexible display panel, and a first protection film adhered to the flexible display panel and including a plurality of grooves having different sizes from each other.

Another aspect is a display device including a flexible display panel, and a first protection film adhered to the flexible display panel and including a plurality of openings having different sizes from each other and a signal layer applied with a signal.

Another aspect is a display device comprising: a flexible display panel; and a first protection film attached to the flexible display panel and including a plurality of openings at least two of which have different sizes.

In the above display device, the first protection film has a mesh shape in a plane view. In the above display device, the first protection film is thicker than the flexible display panel. In the above display device, the first protection film includes an organic material. In the above display device, the flexible display panel has a shape that is bent in one direction, and wherein the flexible display panel includes: a first bending portion having a first curvature radius; and a second bending portion having a second curvature radius smaller than the first curvature radius.

In the above display device, the second bending portion is closer to a border of the flexible display panel than the first bending portion. In the above display device, the openings include: a first opening having a first size and overlapping the first bending portion in the depth dimension of the display device; and a second opening having a second size different from the first size and overlapping the second bending portion in the depth dimension of the display device.

In the above display device, the second size is larger than the first size. In the above display device, the first protection film includes: a first film portion having a first thickness, wherein the first film portion is formed on the same layer as the openings and overlaps the first bending portion in the depth dimension of the display device; and a second film portion having a second thickness different from the first thickness, wherein the second film portion is formed on the same layer as the first film portion and overlaps the second bending portion in the depth dimension of the display device.

In the above display device, the second thickness is less than the first thickness. The above display device further comprises: a first adhesive layer positioned between the first protection film and the flexible display panel, wherein the first adhesive layer is positioned inside the openings. The above display device further comprises: a second protection film attached to the first protection film and covering the openings. The above display device further comprises: a second adhesive layer positioned between the first protection film and the second protection film, wherein the second adhesive layer is positioned inside the openings. The above display device further comprises: a polarizer positioned over the first protection film via the flexible display panel; and a window positioned over the polarizer.

Another aspect is a display device comprising: a flexible display panel including a first bending portion and a second bending portion bent in one direction; and a first protection film attached to the flexible display panel and having first and second openings that have different sizes, wherein the first and second openings respectively overlap the first and second bending portions in the depth dimension of the display device.

In the above display device, the second bending portion has a smaller curvature radius than the first bending portion, and wherein the second opening is larger than the first opening. In the above display device, the first film portion is formed on the same layer as the first opening and overlaps the first bending portion in the depth dimension of the display device, and wherein the second film portion is formed on the same layer as the first film portion and overlaps the second bending portion in the depth dimension of the display device, and wherein the first film portion is thinner than the second film portion.

Another aspect is a display device comprising: a flexible display panel; and a film assembly including a first protection film positioned over the flexible display panel, a first adhesive layer positioned between the first protection film and the flexible display panel, and the first protection film and a plurality of openings formed in at least one of the first adhesive layer and having different sizes.

Another aspect is a display device comprising: a flexible display panel; and a first protection film attached to the flexible display panel and including a plurality of grooves having different sizes from each other.

Another aspect is a display device comprising: a flexible display panel; and a first protection film attached to the flexible display panel and including a plurality of openings having different sizes from each other and a signal layer configured to receive a signal.

Another aspect is a display device comprising: a flexible display panel; and a first protection film attached to the flexible display panel and configured to protect the flexible display panel from external impacts, wherein the first protection film has a plurality of quadrangular openings.

In the above display device, at least two of the openings have different sizes.

According to at least one of the disclosed embodiments, although the protection film is included, the display device with improved flexibility is provided.

Furthermore, the display device capable of controlling the position of the neutral plane by using the protection film is provided.

DETAILED DESCRIPTION OF CERTAIN INVENTIVE EMBODIMENTS

Figure 1:
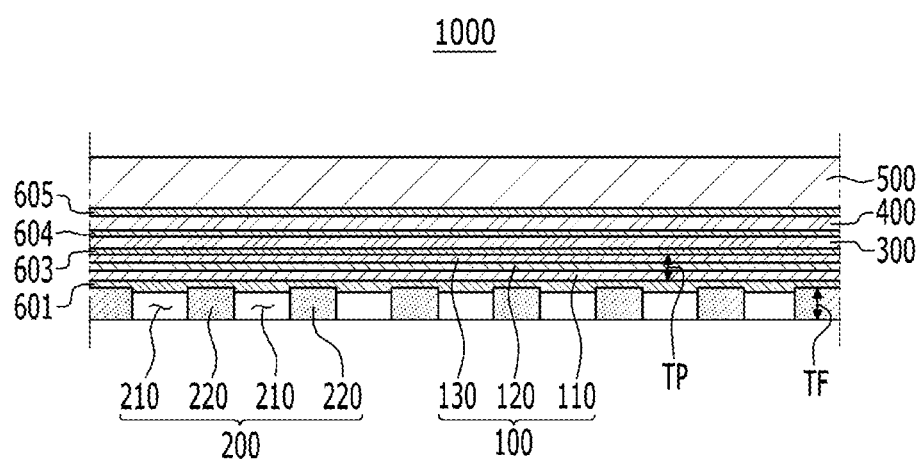
FIG. 1 is a cross-sectional view showing a part of a display device according to an exemplary embodiment.

Embodiments will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Further, since sizes and thicknesses of constituent members shown in the accompanying drawings are arbitrarily given for better understanding and ease of description, the present invention is not limited thereto. In the drawings, the thickness of layers, films, panels, regions, etc., are exaggerated for clarity. In the drawings, for better understanding and ease of description, the thicknesses of some layers and areas are exaggerated.

In this disclosure, the term "substantially" includes the meanings of completely, almost completely or to any significant degree under some applications and in accordance with those skilled in the art. Moreover, "formed, disposed over positioned over" can also mean "formed, disposed or positioned on." The term "connected" includes an electrical connection.

Next, a display device according to an exemplary embodiment will be described with reference to FIG. 1 and FIG. 2.

In the following description, an OLED display is described as one example of the display device, however it is not limited thereto, and the display device according to another exemplary embodiment may be various display devices such as a liquid crystal display (LCD), an electrophoretic display (EPD), or an electrowetting display (EWD) as long as a flexible display panel displaying the image is included.

FIG. 1 is a cross-sectional view showing a part of a display device 1000 according to an exemplary embodiment.

As shown in FIG. 1, the display device 1000 includes a flexible display panel 100, a first protection film 200, a polarizer 300, a touch part 400, a window 500, a first adhesive layer 601, a third adhesive layer 603, a fourth adhesive layer 604, and a fifth adhesive layer 605.

The flexible display panel 100 includes a flexible substrate 110, an organic light-emitting element 120, and a thin film encapsulation layer 130.

The flexible substrate 110 may have a film shape including an organic material such as a polyimide. However the described technology is not limited thereto, and the flexible substrate 110 may include an insulating substrate including a glass. A driving layer including a plurality of thin film transistors connected to the organic light-emitting element 120 may be positioned on the flexible substrate 110, and the driving layer may have various disclosed structures. The flexible substrate 110 is adhered or attached to the first protection film 200 by the first adhesive layer 601. In another exemplary embodiment, the flexible substrate 110 is contacted directly with the first protection film 200.

The organic light-emitting element 120 is positioned on the flexible substrate 110. The organic light-emitting element 120 includes two electrodes facing each other and an organic emission layer positioned between the two electrodes and emitting light. At least one electrode of the two electrodes may be a light transmissive or light translucent electrode. The light emitted from the organic emission layer may be transmitted through the light transmissive or light translucent electrode. The organic light-emitting element 120 may have various disclosed structures.

The thin film encapsulation layer 130 is positioned on the flexible substrate 110 via the organic light-emitting element 120 interposed therebetween. The thin film encapsulation layer 130 encapsulates the organic light-emitting element 120 along with the flexible substrate 110. The thin film encapsulation layer 130 includes at least one organic layer positioned on the organic light-emitting element 120 and at least one inorganic layer positioned on the organic light-emitting element 120.

The first protection film 200 is adhered to the rear surface of the flexible display panel 100. The film thickness TF of the first protection film 200 is thicker than a panel thickness TP of the flexible display panel 100. The first protection film 200 protects the flexible display panel 100 from external interference. The first protection film 200 is an insulating protection film including the organic material. The first protection film 200 includes a plurality of openings 210 and a rib part 220.

Figure 2:
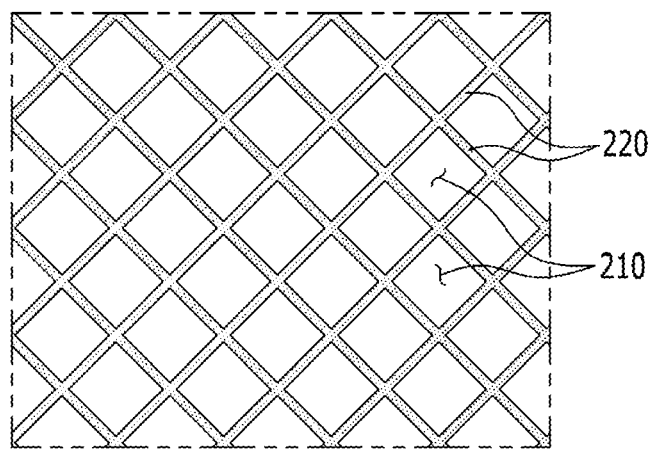
FIG. 2 is a top plan view showing a part of the first protection film shown in FIG. 1.

FIG. 2 is a top plan view showing a part of the first protection film shown in FIG. 1.

As shown in FIG. 1 and FIG. 2, the first protection film 200 has a mesh shape in a plane view formed by the openings 210 and the rib part 220.

The openings 210 penetrate the first protection film 200 in the thickness direction of the first protection film 200. The openings 210 have a quadrangle shape in a plane view, however the described technology is not limited thereto, and the openings 210 may have various polygonal shapes such as a triangle, a pentagon, a hexagon, a heptagon, an octagon, a circle, an oval, a closed loop, and an opened loop. FIG. 2 shows that the openings 210 are of the same size, however they may have different sizes. At least two of the openings 210 can have different sizes, and in one embodiment, all of the openings 210 have different sizes.

The rib part 220 defines the size of the openings 210. Here, the size may mean an area, a volume, or a width of the opening 210, however it is not limited thereto.

The rib part 220 has the mesh shape in a plane view. As the rib part 220 has the mesh shape, the first protection film 200 has the mesh shape in a plane view.

As the first protection film 200 is the insulating protection film including the organic material and has the mesh shape in a plane view, and since the first protection film 200 is easily stretched or bent, the flexibility of the first protection film 200 is improved.

Again referring to FIG. 1, the polarizer 300 is positioned on the flexible display panel 100. For example, the polarizer 300 is positioned on the first protection film 200 via the flexible display panel 100 interposed therebetween. The polarizer 300 is positioned between the flexible display panel 100 and the touch part 400. The polarizer 300 may include a phase retardation film and a linear polarizer suppressing reflection of the flexible display panel 100 by external light, however it is not limited thereto, and various disclosed optical plates may be included.

The touch part 400 is positioned on the polarizer 300. For example, the touch part 400 is positioned between the polarizer 300 and the window 500. The touch part 400 includes a touch sensor unit recognizing a user's touch. The touch sensor unit included in the touch part 400 may have various disclosed structures. In another exemplary embodiment, the touch part 400 may be positioned between the polarizer 300 and the flexible display panel 100, may be positioned inside the flexible display panel 100, may be positioned between the flexible display panel 100 and the first protection film 200, or may be positioned at a front surface of the window 500.

The window 500 is positioned on the polarizer 300 via the touch part 400 interposed therebetween. The window 500 protects the flexible display panel 100 from the external interference. The window 500 may transmit light, and may be flexible or rigid.

The first adhesive layer 601 is positioned between the first protection film 200 and the flexible display panel 100. The first adhesive layer 601 is respectively adhered to the first protection film 200 and the flexible display panel 100 and adheres between the first protection film 200 and the flexible display panel 100. Also, the first adhesive layer 601 is positioned inside the openings 210 of the first protection film 200.

The third adhesive layer 603 is positioned between the flexible display panel 100 and the polarizer 300. The third adhesive layer 603 adheres between the flexible display panel 100 and the polarizer 300.

The fourth adhesive layer 604 is positioned between the polarizer 300 and the touch part 400. The fourth adhesive layer 604 adheres between the polarizer 300 and the touch part 400.

The fifth adhesive layer 605 is positioned between the touch part 400 and the window 500. The fifth adhesive layer 605 adheres between the touch part 400 and the window 500.

The first adhesive layer 601, the third adhesive layer 603, the fourth adhesive layer 604, and the fifth adhesive layer 605 that are described above may be respectively omitted, and in this case, the flexible display panel 100, the first protection film 200, the polarizer 300, touch part 400, and the window 500 may be contacted directly to each other, respectively.

As described above, in the display device 1000 according to an exemplary embodiment, the first protection film 200 adhered to the flexible display panel 100 is the insulating protection film including the organic material and has the mesh shape in a plane view. Accordingly, the first protection film 200 may be easily stretched and bent such that the flexibility of the first protection film 200 is improved.

That is, as the flexibility of the first protection film 200 adhered to the flexible display panel 100 is improved, although the first protection film 200 including the flexible display panel 100 is applied, the display device 1000 with improved flexibility is provided.

The display device according to another exemplary embodiment will be described with reference to FIG. 3.

Hereinafter, differences from the display device according to an exemplary embodiment described with reference to FIG. 1 will be described.

Figure 3:
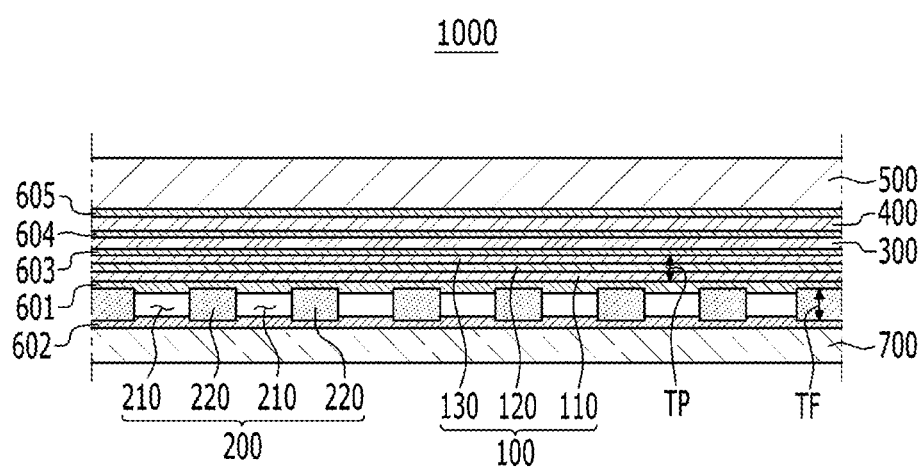
FIG. 3 is a cross-sectional view showing a part of a display device according to another exemplary embodiment.

FIG. 3 is a cross-sectional view showing a part of a display device 1000 according to another exemplary embodiment.

As shown in FIG. 3, the display device 1000 includes a flexible display panel 100, a first protection film 200, a polarizer 300, a touch part 400, a window 500, a first adhesive layer 601, a third adhesive layer 603, a fourth adhesive layer 604, a fifth adhesive layer 605, a second protection film 700, and a second adhesive layer 602.

The second protection film 700 is adhered to the rear surface of the first protection film 200. The second protection film 700 covers the openings 210 of the first protection film 200.

The second adhesive layer 602 is positioned between the first protection film 200 and the second protection film 700. The second adhesive layer 602 is adhered to the first protection film 200 and the second protection film 700, respectively, and adheres between the first protection film 200 and the second protection film 700. Also, the second adhesive layer 602 is positioned inside the openings 210 of the first protection film 200.

As described above, in the display device 1000 according to the present exemplary embodiment, as the second protection film 700 is adhered to the first protection film 200 and covers the openings 210 of the first protection film 200, the first adhesive layer 601 positioned between the flexible display panel 100 and the first protection film 200 may be suppressed from flowing outside through the openings 210 of the first protection film 200.

Next, the display device according to another exemplary embodiment will be described with reference to FIG. 4, FIG. 5A, and FIG. 5B.

Hereinafter, differences from the display device according to an exemplary embodiment described with reference to FIG. 1 will be described.

Figure 4:
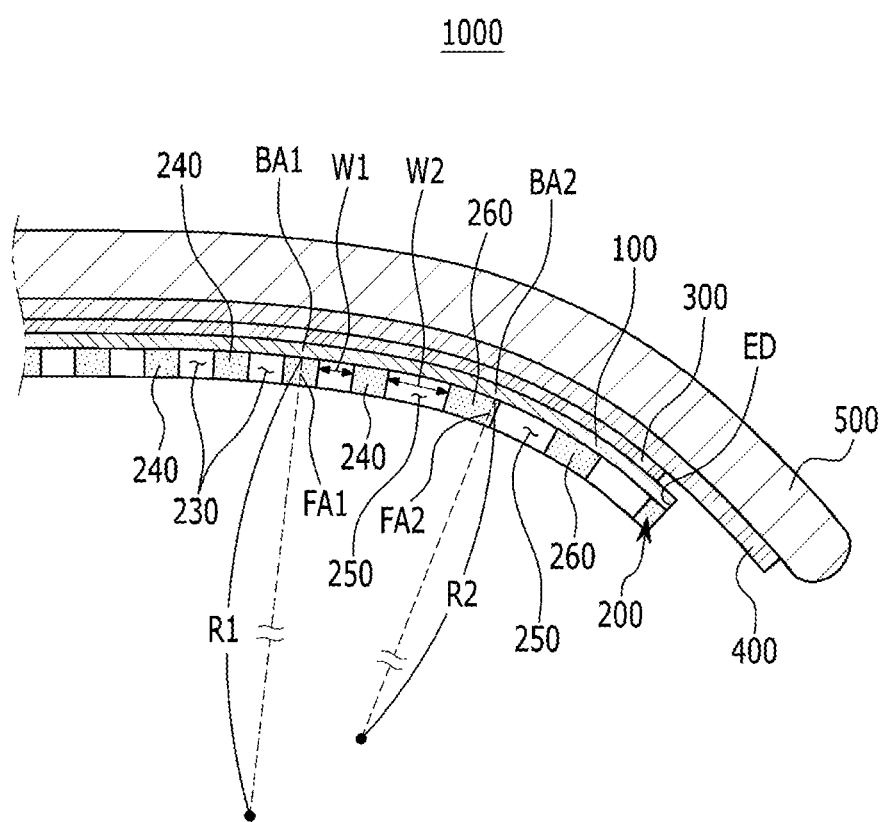
FIG. 4 is a cross-sectional view showing a part of an end side of a display device according to another exemplary embodiment.

FIG. 4 is a cross-sectional view showing a part of an end side of a display device 1000 according to another exemplary embodiment.

In FIG. 4, the adhesive layer is not positioned between the adjacent configurations, however the adhesive layer may be positioned between the adjacent configurations in another exemplary embodiment. Also, in FIG. 4, for convenience of description, it is shown to simplify the flexible display panel as one layer.

As shown in FIG. 4, the display device 1000 is entirely bent in one direction, and includes a flexible display panel 100, a first protection film 200, a polarizer 300, a touch part 400, and a window 500. The flexible display panel 100, the first protection film 200, the polarizer 300, the touch part 400, and window 500 respectively have the shape bent in one direction.

The flexible display panel 100 has the shape that is bent in one direction, and includes a first bending part or portion BA1 and a second bending part or portion BA2.

The first bending part BA1 has a first curvature radius R1. Here, the first bending part BA1 having the first curvature radius R1 may mean that one surface of the first bending part BA1 of the flexible display panel 100 has the first curvature radius R1.

The second bending part BA2 is adjacent to the first bending part BA1. The second bending part BA2 has a second curvature radius R2 smaller than the first curvature radius R1. The second bending part BA2 is positioned to be closer to an edge ED of the flexible display panel 100 compared with the first bending part BA1.

In another exemplary embodiment, the first bending part BA1 is positioned to be closer to the edge ED of the flexible display panel 100 compared with the second bending part BA2.

The first protection film 200 is adhered to the rear surface of the flexible display panel 100, and includes a first film part FA1 corresponding to the first bending part BA1 and a second film part FA2 corresponding to the second bending part BA2. The second film part FA2 has the smaller curvature radius than that of the first film part FA1.

The first protection film 200 includes a plurality of openings having different sizes. For example, the first protection film 200 includes a plurality of first openings 230 and a first rib part 240 positioned at the first film part FA1, and a plurality of second openings 250 and a second rib part 260 positioned at the second film part FA2. That is, the openings included in the first protection film 200 and having the different sizes include a plurality of first openings 230 and a plurality of second openings 250.

Figure 5A:
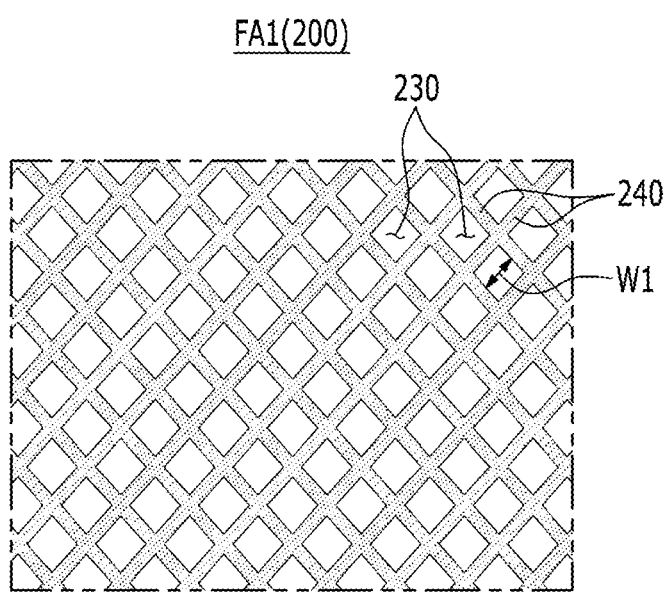
FIG. 5A is a top plan view showing a part of a first film part of the first protection film shown in FIG. 4.

FIG. 5A is a top plan view showing a part of a first film part of the first protection film shown in FIG. 4.

As shown in FIG. 4 and FIG. 5A, the first film part FA1 of the first protection film 200 has the mesh shape in a plane view by the first openings 230 and the first rib part 240.

The first openings 230 penetrate the first film part FA1 of the first protection film 200 in the thickness direction of the first protection film 200. The first openings 230 have a first size W1 corresponding to the first bending part BA1 of the first curvature radius R1.

The first rib part 240 defines the size of the first openings 230. Here, the size may mean the area, the volume, or the width of the first opening 230, however it is not limited thereto.

The first rib part 240 has the mesh shape in a plane view. As the first rib part 240 has the mesh shape, the first film part FA1 of the first protection film 200 has the mesh shape in a plane view.

As the first film part FA1 of the first protection film 200 corresponds to the first curvature radius R1 of the first bending part BA1 of the flexible display panel 100 and includes the first openings 230 and the first rib part 240 having the first size W1 thereby having the mesh shape in a plane view, since the first film part FA1 of the first protection film 200 may be easily stretched and bent, the flexibility of the first film part FA1 of the first protection film 200 is improved.

Figure 5B:
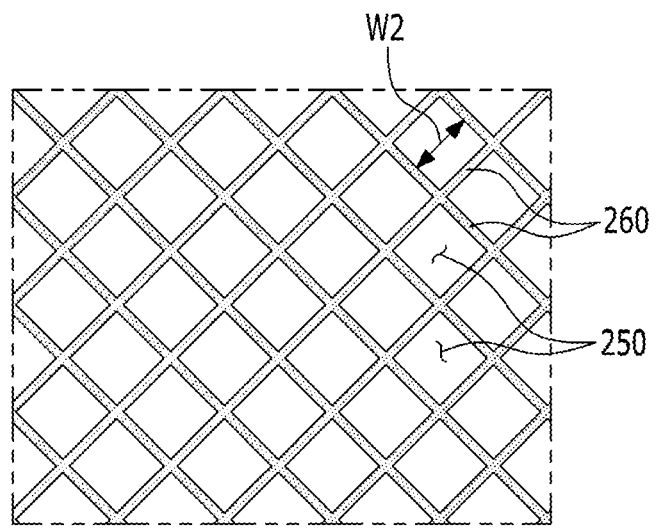
FIG. 5B is a top plan view showing a part of a second film part of the first protection film shown in FIG. 4.

FIG. 5B is a top plan view showing a part of a second film part of the first protection film shown in FIG. 4.

As shown in FIG. 4 and FIG. 5B, the second film part FA2 of the first protection film 200 has the mesh shape in a plane view by a plurality of second openings 250 and the second rib part 260.

The second openings 250 penetrate the second film part FA2 of the first protection film 200 in the thickness direction of the first protection film 200. The second openings 250 have the larger second size W2 than the first size W1 of the first opening 230 by corresponding to the second bending part BA2 having the second curvature radius R2. Here, the first size W1 may mean the area, the volume, or the width of the first opening 230, however it is not limited thereto. Also, the second size W2 may mean the area, the volume, or the width of the second opening 250, however it is not limited thereto.

The second rib part 260 defines the size of the second openings 250. Here, the size may mean the area, the volume, or the width of the second opening 250, however it is not limited thereto.

The second rib part 260 has the mesh shape in a plane view. As the second rib part 260 has the mesh shape, the second film part FA2 of the first protection film 200 has the mesh shape in a plane view. The second rib part 260 may be integrally formed with the first rib part 240, or may be connected to the first rib part 240. The second rib part 260 may have the narrower width than the first rib part 240, however it is not limited thereto.

As the second film part FA2 of the first protection film 200 corresponds to the second curvature radius R2 of the second bending part BA2 smaller than the first curvature radius R1 of the first bending part BA1 of the flexible display panel 100 such that the first opening 230 includes the second openings 250 and the second rib part 260 having the second size W2 larger than the first size and has the mesh shape in a plane view, since the second film part FA2 of the first protection film 200 may be easily stretched and bent compared with the first film part FA1, the flexibility of the second film part FA2 of the first protection film 200 may be further improved compared with the first film part FA1.

That is, the first protection film 200 includes the first film part FA1 including the first openings 230 having the first size W1 by corresponding to the first bending part BA1 having the first curvature radius R1 of the flexible display panel 100 and includes the second film part FA2 including the second openings 250 having the second size W2 larger than the first size W1 by corresponding to the second bending part BA2 having the second curvature radius R2 smaller than first curvature radius R1.

Accordingly, as the flexibility of the second film part FA2 of the first protection film 200 may be further improved compared with the first film part FA1, although the second curvature radius R2 of the second bending part BA2 of the flexible display panel 100 corresponding to the second film part FA2 is smaller compared with the first curvature radius R1 of the first bending part BA1 of the flexible display panel 100 corresponding to the first film part FA1, the display device 1000 with improved overall flexibility is provided.

Also, as the second film part FA2 of the first protection film 200 has the improved flexibility compared with the first film part FA1, a position of a neutral plane formed at the display device 1000 corresponding to the second bending part BA2 of the flexible display panel 100 may be moved in the direction of the flexible display panel 100 compared with the neutral plane formed at the display device 1000 corresponding to the first bending part BA1.

In detail, if the display device 1000 is bent, one neutral plane is formed in one where that the first protection film 200 and the flexible display panel 100 are combined. In this case, as the second film part FA2 of the first protection film 200 has the further improved flexibility compared with the first film part FA1, the position of the neutral plane formed corresponding to the second bending part BA2 of the flexible display panel 100 may be moved in the direction of the flexible display panel 100 compared with the neutral plane formed corresponding to the first bending part BA1. When bending the display device 1000, in the case that the neutral plane is formed in the flexible display panel 100, the stress applied to the flexible display panel 100 may be suppressed.

That is, the display device 1000 in which the position of the neutral plane may be controlled by using the first protection film 200 is provided.

Next, the display device according to another exemplary embodiment will be described with reference to FIG. 6.

Hereinafter, differences from the display device according to the exemplary embodiment described with reference to FIG. 4 will be described.

Figure 6:
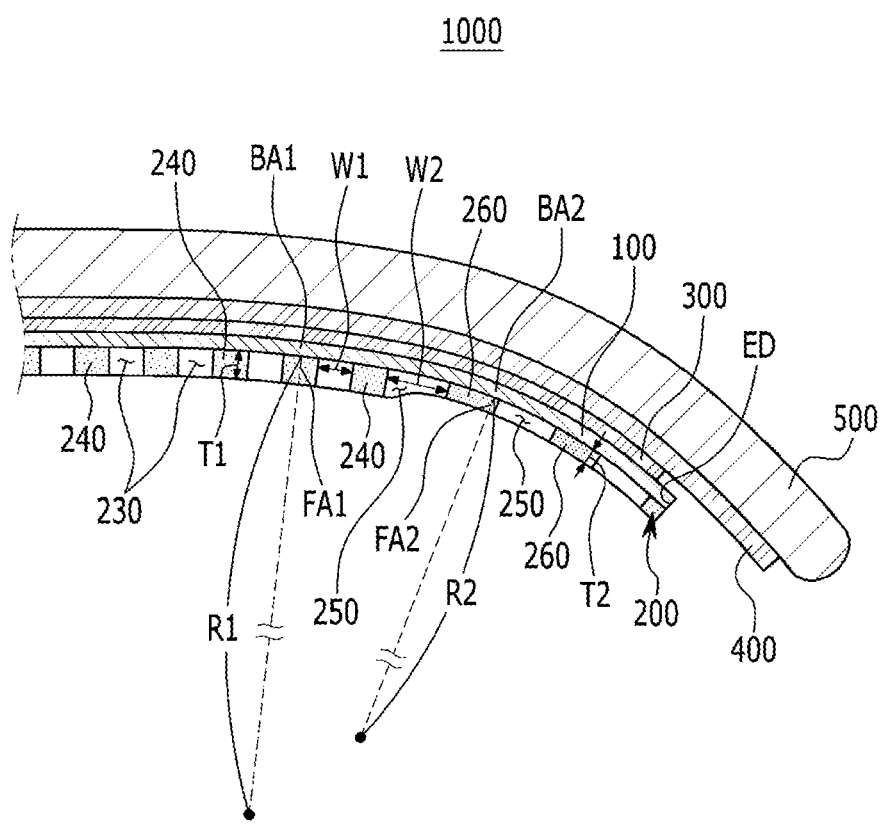
FIG. 6 is a cross-sectional view showing a part of an end side of a display device according to another exemplary embodiment.

FIG. 6 is a cross-sectional view showing a part of an end side of a display device 1000 according to another exemplary embodiment.

As shown in FIG. 6, the display device 1000 is entirely bent in one direction and includes a flexible display panel 100, a first protection film 200, a polarizer 300, a touch part 400, and a window 500. The flexible display panel 100, the first protection film 200, the polarizer 300, the touch part 400, and the window 500 have the shape that is bent in one direction, respectively.

The flexible display panel 100 has the shape that is bent in one direction, and includes the first bending part BA1 having the first curvature radius R1 and the second bending part BA2 having the second curvature radius R2 smaller than the first curvature radius R1.

The first protection film 200 includes the first film part FA1 corresponding to the first bending part BA1 and the second film part FA2 corresponding to the second bending part BA2.

The first film part FA1 has the first thickness T1.

The second film part FA2 is adjacent to the first film part FA1. The second film part FA2 has the second thickness T2 thinner than the first thickness T1.

That is, the first protection film 200 includes the first film part FA1 having the first thickness T1 by corresponding to the first bending part BA1 having the first curvature radius R1 of the flexible display panel 100, and includes the second film part FA2 having the second thickness T2 thinner than the first thickness T1 by corresponding to the second bending part BA2 having the second curvature radius R2 smaller than the first curvature radius R1.

Accordingly, as the flexibility of the second film part FA2 of the first protection film 200 is further improved compared with the first film part FA1, although the second curvature radius R2 of the second bending part BA2 of the flexible display panel 100 corresponding to the second film part FA2 is smaller than the first curvature radius R1 of the first bending part BA1 of the flexible display panel 100 corresponding to the first film part FA1, the display device 1000 with improved overall flexibility is provided.

Also, since the second thickness T2 of the second film part FA2 of the first protection film 200 is thinner than the first thickness T1 of the first film part FA1, the position of the neutral plane formed at the display device 1000 corresponding to the second bending part BA2 of the flexible display panel 100 may be moved in the direction of the flexible display panel 100 compared with the neutral plane formed at the display device 1000 corresponding to the first bending part BA1.

In detail, if the display device 1000 is bent, one neutral plane is formed at one layer where the first protection film 200 and the flexible display panel 100 are combined. In this case, since the second thickness T2 of the second film part FA2 of the first protection film 200 is thinner than the first thickness T1 of the first film part FA1, the position of the neutral plane formed corresponding to the second bending part BA2 of the flexible display panel 100 may be moved in the direction of the flexible display panel 100 compared with the neutral plane formed corresponding to the first bending part BA1. In the case that the neutral plane is formed at the flexible display panel 100 when bending the display device 1000, the stress applied to the flexible display panel 100 may be suppressed.

That is, the display device 1000 capable of controlling the position of the neutral plane by using the first protection film 200 is provided.

Next, the display device according to another exemplary embodiment will be described with reference to FIG. 7.

Hereinafter, differences from the display device according to an exemplary embodiment described with reference to FIG. 1 will be described.

Figure 7:
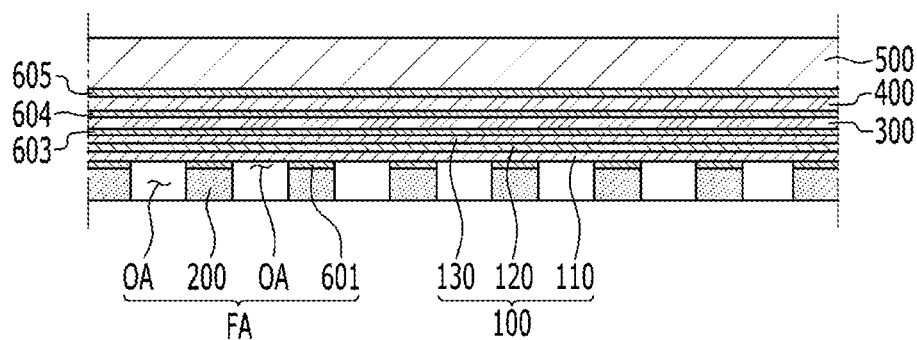
FIG. 7 is a cross-sectional view showing a part of a display device according to another exemplary embodiment.

FIG. 7 is a cross-sectional view showing a part of a display device 1000 according to another exemplary embodiment.

As shown in FIG. 7, the display device 1000 includes a flexible display panel 100, a film assembly FA, a polarizer 300, a touch part 400, a window 500, a third adhesive layer 603, a fourth adhesive layer 604, and a fifth adhesive layer 605.

The film assembly FA includes a first protection film 200, a first adhesive layer 601, and a plurality of openings OA.

The first protection film 200 is positioned on the flexible display panel 100.

The first adhesive layer 601 is positioned between the flexible display panel 100 and the first protection film 200. The first adhesive layer 601 adheres between the flexible display panel 100 and the first protection film 200. The first protection film 200 is adhered to the rear surface of the flexible display panel 100 by the first adhesive layer 601.

The openings OA are formed in at least one of the first protection film 200 and the first adhesive layer 601. The openings OA are formed in the first protection film 200 and the first adhesive layer 601, respectively. The openings OA formed in the first protection film 200 and the openings OA formed in the first adhesive layer 601 are overlapped to each other. Accordingly, The openings OA formed in the first protection film 200 and the openings OA formed in the first adhesive layer 601 communicate with each other. The openings OA respectively penetrate the first protection film 200 and the first adhesive layer 601. The openings OA have a quadrangle shape in a plane view, however they are not limited thereto, and the openings 210 may have various polygonal shapes such as the triangle, the pentagon, the hexagon, the heptagon, the octagon, the circle, the oval, the closed loop, and the opened loop. The openings OA have different sizes from each other, however they are not limited thereto, and they may have the same size.

As described above, in the display device 1000 according to another exemplary embodiment, as the flexibility of the film assembly FA including the first protection film 200 and the first adhesive layer 601 adhered to the flexible display panel 100 may be improved, even if the film assembly FA protecting the flexible display panel 100 is included, the display device 1000 with improved flexibility is provided.

Next, the display device according to another exemplary embodiment will be described with reference to FIG. 8.

Hereinafter, differences from the display device according to an exemplary embodiment described with reference to FIG. 1 will be described.

Figure 8:
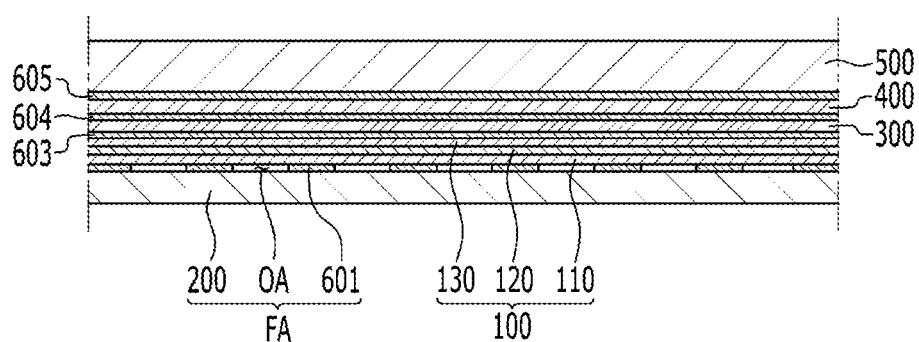
FIG. 8 is a cross-sectional view showing a part of a display device according to another exemplary embodiment.

FIG. 8 is a cross-sectional view showing a part of a display device 1000 according to another exemplary embodiment.

As shown in FIG. 8, the display device 1000 includes a flexible display panel 100, a film assembly FA, a polarizer 300, a touch part 400, a window 500, a third adhesive layer 603, a fourth adhesive layer 604, and a fifth adhesive layer 605.

The film assembly FA includes a first protection film 200, a first adhesive layer 601, and a plurality of openings OA.

The first protection film 200 is positioned on the flexible display panel 100.

The first adhesive layer 601 is positioned between the flexible display panel 100 and the first protection film 200. The first adhesive layer 601 adheres between the flexible display panel 100 and the first protection film 200. The first protection film 200 is adhered to the rear surface of the flexible display panel 100 of the first adhesive layer 601.

The openings OA are formed in the first adhesive layer 601. The openings OA are formed only in the first adhesive layer 601. The first protection film 200 covers the openings OA formed in the first adhesive layer 601. The openings OA penetrate the first adhesive layer 601. The openings OA have a quadrangle shape in a plane view, however they are not limited thereto, and the openings 210 may have various polygonal shapes such as the triangle, the pentagon, the hexagon, the heptagon, the octagon, the circle, the oval, the closed loop, and the opened loop. The openings OA have the different sizes from each other, however they are not limited thereto, and they may have the same size.

As described above, in the display device 1000 of FIG. 8, as the flexibility of the first adhesive layer 601 adhered to the flexible display panel 100 is improved, even if the film assembly FA protecting the flexible display panel 100 is included, the display device 1000 with improved flexibility is provided.

Next, the display device according to another exemplary embodiment will be described with reference to FIG. 9.

Hereinafter, differences from the display device according to an exemplary embodiment described with reference to FIG. 1 will be described.

Figure 9:
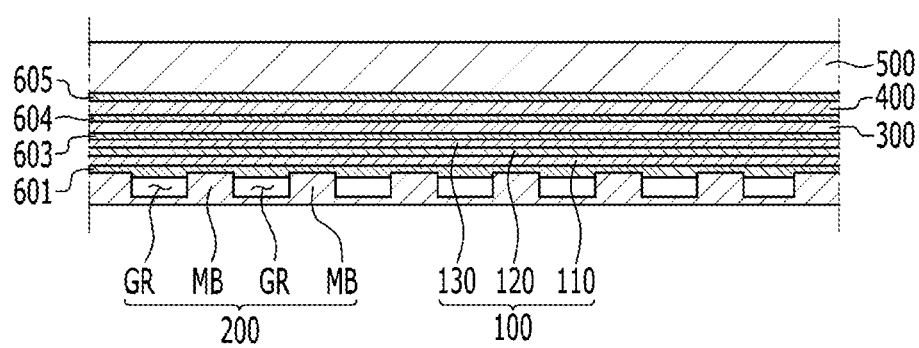
FIG. 9 is a cross-sectional view showing a part of a display device according to another exemplary embodiment.

FIG. 9 is a cross-sectional view showing a part of a display device 1000 according to another exemplary embodiment.

As shown in FIG. 9, the display device 1000 includes a flexible display panel 100, a first protection film 200, a polarizer 300, a touch part 400, a window 500, a first adhesive layer 601, a third adhesive layer 603, a fourth adhesive layer 604, and a fifth adhesive layer 605.

The first protection film 200 includes a main body part MB and a plurality of grooves GR.

The main body part MB is adhered to the rear surface of the flexible display panel 100 by the first adhesive layer 601.

The grooves GR have a shape that is recessed from the upper surface of the main body part MB. The first adhesive layer 601 is positioned inside the grooves GR, however it is not limited thereto, and the first adhesive layer 601 may include the opening overlapping the grooves GR.

The grooves GR have a quadrangle shape in a plane view, however they are not limited thereto, and the openings 210 may have various polygonal shapes such as the triangle, the pentagon, the hexagon, the heptagon, the octagon, the circle, the oval, the closed loop, and the opened loop. The grooves GR have different sizes from each other, however they are not limited thereto, and they may have the same size.

As described above, in the display device 1000 according to another exemplary embodiment, as the first protection film 200 is adhered to the flexible display panel 100 by the grooves GR, even if the first protection film 200 protecting the flexible display panel 100 is increased, the display device 1000 with improved flexibility is provided.

Next, the display device according to another exemplary embodiment will be described with reference to FIG. 10.

Hereinafter, differences from the display device according to an exemplary embodiment described with reference to FIG. 1 will be described.

Figure 10:
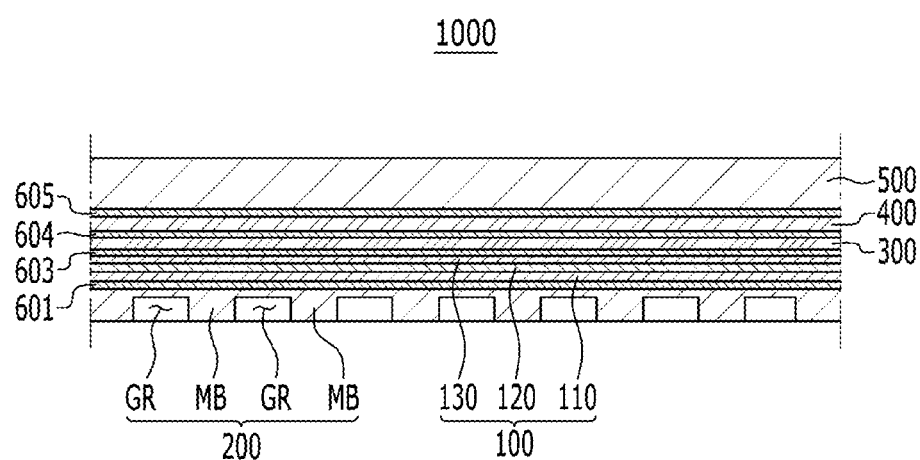
FIG. 10 is a cross-sectional view showing a part of a display device according to another exemplary embodiment.

FIG. 10 is a cross-sectional view showing a part of a display device 1000 according to another exemplary embodiment.

As shown in FIG. 10, the display device 1000 includes a flexible display panel 100, a first protection film 200, a polarizer 300, a touch part 400, a window 500, a first adhesive layer 601, a third adhesive layer 603, a fourth adhesive layer 604, and a fifth adhesive layer 605.

The first protection film 200 includes the main body part MB and the grooves GR.

The main body part MB is adhered to the rear surface of the flexible display panel 100 by the first adhesive layer 601.

The grooves GR may have the shape that is recessed from the lower surface of the main body part MB.

The grooves GR have a quadrangle shape in a plane view, however they are not limited thereto, and the openings 210 may have various polygonal shapes such as the triangle, the pentagon, the hexagon, the heptagon, the octagon, the circle, the oval, the closed loop, and the opened loop. The grooves GR have different sizes from each other, however they are not limited thereto, and they may have the same size.

As described above, in the display device 1000 of FIG. 10, as the first protection film 200 is adhered to the flexible display panel 100 by the grooves GR, even if the first protection film 200 protecting the flexible display panel 100 is increased, the display device 1000 with improved flexibility is provided.

Next, the display device according to another exemplary embodiment will be described with reference to FIG. 11.

Hereinafter, differences from the display device according to an exemplary embodiment described with reference to FIG. 1 will be described.

Figure 11:
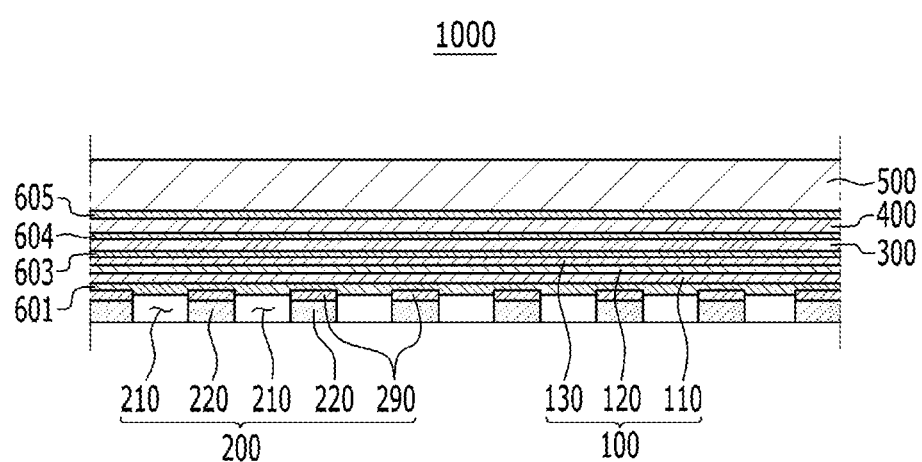
FIG. 11 is a cross-sectional view showing a part of a display device according to another exemplary embodiment.

FIG. 11 is a cross-sectional view showing a part of a display device 1000 according to another exemplary embodiment.

As shown in FIG. 11, the display device 1000 includes a flexible display panel 100, a first protection film 200, a polarizer 300, a touch part 400, a window 500, a first adhesive layer 601, a third adhesive layer 603, a fourth adhesive layer 604, and a fifth adhesive layer 605.

The first protection film 200 includes a plurality of openings 210, a rib part 220, and a signal layer 290.

The signal layer 290 may be positioned at any one among an upper part, a center part, and a lower part of the rib part 220, and is applied with signals from the outside. Here, the signal may be various signals such as a touch signal recognizing a touch, a pressure signal recognizing a pressure, a stress signal recognizing a stress, a voltage signal recognizing a voltage, and a current signal recognizing a current. The signal layer 290 may include at least one thin film transistor and at least one signal wire, and may have various disclosed structures if the signal may be applied.

According to at least one of the disclosed embodiments, as the first protection film adhered to the flexible display panel includes the signal layer applying the signal, the display device performing various sensing is provided.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a flexible display panel; and
   a first protection film attached to the flexible display panel and including a plurality of openings at least two of which have different sizes, wherein the first protection film is thicker than the flexible display panel, and wherein at least a portion of the first protection film has a mesh shape in a plane view.

2. The display device of claim 1, wherein the first protection film includes an organic material.

3. The display device of claim 1, further comprising:
   a polarizer positioned over the first protection film via the flexible display panel; and
   a window positioned over the polarizer.

4. The display device of claim 1, further comprising:
   a first adhesive layer positioned between the first protection film and the flexible display panel, wherein the first adhesive layer is positioned inside the openings.

5. The display device of claim 1, further comprising:
   a second protection film attached to the first protection film and covering the openings.

6. The display device of claim 5, further comprising:
   a second adhesive layer positioned between the first protection film and the second protection film, wherein the second adhesive layer is positioned inside the openings.

7. A display device comprising:
   a flexible display panel; and
   a first protection film attached to the flexible display panel and including a plurality of openings at least two of which have different sizes,
   wherein the flexible display panel has a shape that is bent in one direction, and wherein the flexible display panel includes:
   a first bending portion having a first curvature radius; and a second bending portion having a second curvature radius smaller than the first curvature radius.

8. The display device of claim 7, wherein the second bending portion is closer to a border of the flexible display panel than the first bending portion.

9. The display device of claim 7, wherein the openings include:
a first opening having a first size and overlapping the first bending portion in the depth dimension of the display device; and
a second opening having a second size different from the first size and overlapping the second bending portion in the depth dimension of the display device.

10. The display device of claim 9, wherein the second size is larger than the first size.

11. The display device of claim 7, wherein the first protection film includes:
a first film portion having a first thickness, wherein the first film portion is formed on the same layer as the openings and overlaps the first bending portion in the depth dimension of the display device; and
a second film portion having a second thickness different from the first thickness, wherein the second film portion is formed on the same layer as the first film portion and overlaps the second bending portion in the depth dimension of the display device.

12. The display device of claim 11, wherein the second thickness is less than the first thickness.

13. A display device comprising:
a flexible display panel including a first bending portion and a second bending portion bent in one direction; and
a first protection film attached to the flexible display panel and having first and second openings that have different sizes, wherein the first and second openings respectively overlap the first and second bending portions in the depth dimension of the display device.

14. The display device of claim 13, wherein the second bending portion has a smaller curvature radius than the first bending portion, and wherein the second opening is larger than the first opening.

15. The display device of claim 14, wherein the first protection film comprises a first film portion that has a first thickness and is formed on the same layer as the first opening and overlaps the first bending portion in the depth dimension of the display device, and wherein the first protection film further comprises a second film portion that has a second thickness different from the first thickness and is formed on the same layer as the first film portion and overlaps the second bending portion in the depth dimension of the display device, and wherein the first film portion is thinner than the second film portion.

16. A display device comprising:
a flexible display panel; and
a film assembly including a first protection film positioned over the flexible display panel, a first adhesive layer positioned between the first protection film and the flexible display panel, and a plurality of openings formed in at least one of the first protection film and the first adhesive layer, wherein the plurality of openings have different sizes, wherein the first protection film is thicker than the flexible display panel, and wherein the plurality of opening are formed to penetrate an entire thickness of the at least one of the first protection film and the first adhesive layer.

17. A display device comprising:
a flexible display panel; and
a first protection film attached to the flexible display panel and including a plurality of grooves having different sizes from each other, wherein the first protection film is thicker than the flexible display panel, and wherein at least a portion of the first protection film has a mesh shape in a plane view.

18. A display device comprising:
a flexible display panel; and
a first protection film attached to the flexible display panel and including a plurality of openings having different sizes from each other and a signal layer configured to receive a signal, wherein the first protection film is thicker than the flexible display panel, and wherein at least a portion of the first protection film has a mesh shape in a plane view.

* * * * *